(12) United States Patent
Sung

(10) Patent No.: US 7,315,116 B2
(45) Date of Patent: Jan. 1, 2008

(54) ORGANIC ELECTROLUMINESCENT DISPLAY DEVICE WITH SEPARATELY CONNECTED SIGNAL LINES AND POWER LINES

(75) Inventor: Chao-Chin Sung, Pingtung (TW)

(73) Assignee: AU Optronics Corporation, Hsin-Chu (TW)

( * ) Notice: Subject to any disclaimer, the term of this patent is extended or adjusted under 35 U.S.C. 154(b) by 118 days.

(21) Appl. No.: 10/887,633

(22) Filed: Jul. 9, 2004

(65) Prior Publication Data

US 2006/0007381 A1    Jan. 12, 2006
US 2007/0153207 A9    Jul. 5, 2007

(51) Int. Cl.
  *H01J 9/00*   (2006.01)
  *H01J 1/62*   (2006.01)
  *G02F 1/1345* (2006.01)

(52) U.S. Cl. .................. 313/503; 349/149; 349/153; 445/24

(58) Field of Classification Search .................. 313/503
See application file for complete search history.

(56) References Cited

U.S. PATENT DOCUMENTS 4,640,583 A * 2/1987 Hoshikawa et al. ........ 349/153
6,348,906 B1 * 2/2002 Dawson et al. ............. 345/82
6,424,400 B1 * 7/2002 Kawasaki .................... 349/149
7,218,295 B2 * 5/2007 Sung ........................... 345/82
2002/0014851 A1 * 2/2002 Tai et al. ................... 315/169.3
2003/0090480 A1 * 5/2003 Polgar et al. ............... 345/206
2005/0162603 A1 * 7/2005 Cheng et al. ................ 349/149

OTHER PUBLICATIONS

U.S. Appl. No. 10/766,536, filed Jan. 27, 2004, Ping-Chin Cheng et al.

* cited by examiner

*Primary Examiner*—Sikha Roy
*Assistant Examiner*—Natalie K. Walford
(74) *Attorney, Agent, or Firm*—Duane Morris LLP

(57) ABSTRACT

A display device includes a TFT-OLED (thin-film transistor—organic light emitting diode) array formed on a substrate and a signal line directly coupled to the substrate and a power line separately coupled to a frame that is joined to the substrate. The signal line is formed on a surface of a circuit board that is joined to the surface of the substrate including the TFT-OLED array, through an anisotropic conductive film. The power line is an electrical cable joined to the frame. When the frame is coupled to the substrate to form the display device, the signal line is peripherally disposed from the OLED power line. The display device can advantageously include a TFT-OLED array of increased dimension because the separately connected OLED power line can accommodate high currents needed for large TFT-OLED arrays without damaging the signal line or the anisotropic conductive film.

1 Claim, 3 Drawing Sheets

ORGANIC ELECTROLUMINESCENT DISPLAY DEVICE WITH SEPARATELY CONNECTED SIGNAL LINES AND POWER LINES

FIELD OF THE INVENTION

The present invention relates to electroluminescent display devices, and more particularly, to display devices formed of organic light-emitting devices, and a method for manufacturing such display devices.

BACKGROUND OF THE INVENTION

OLED's are preferred as display devices because each OLED emits light by itself and backlighting is not required. Therefore, in today's rapidly advancing communication and video display technologies, it is becoming more and more desirable to utilize TFT-OLED (Thin Film Transistor-Organic Light Emitting Diode) arrays as display devices in various applications including those in which the display device is of considerably larger size. A challenge in providing OLED arrays of increased dimension, however, is that the power line and control signal lines necessary to operate the display devices of large dimensions include correspondingly increased power and current levels. When conventional technology is used to form the power and control signal lines of increased power/current levels, they are susceptible to blow out.

Power lines and control signal lines are conventionally formed on a printed circuit board that is coupled to the substrate including the TFT-OLED array. The printed circuit board is advantageously coupled to the substrate by use of an anisotropic conductive film (ACF) that bonds the printed circuit board to the substrate. A method for mounting a flexible printed circuit board to a substrate using an anisotropic conductive film is disclosed in commonly assigned pending U.S. patent application Ser. No. 10/766,536, filed Jan. 27, 2004. The anisotropic conductive film includes a plurality of conductive spheres dispersed in an adhesive resin. When the ACF is interposed between a printed circuit board and substrate and a compressive force is applied, the conductive spheres rupture, providing electrical connection. Typically, the printed circuit board includes a number of terminals associated with conductive lines formed on the printed circuit board and the terminals are electrically coupled to associated contacts on the substrate through the ACF. The contacts may be terminals of interconnect leads that are coupled to the TFT-OLED array. Another shortcoming associated with using conventional technology to form display devices including large OLED arrays, is that when a control signal line and power line are coupled to a substrate through an ACF and the necessarily high current is applied, the resulting high temperatures can cause the ACF to break down and undesirably short together terminals and contacts that are in close proximity to one another.

A prior art TFT-OLED arrangement is shown in FIG. 1. FIG. 1 shows TFT-OLED array 100 formed on substrate 102. The OLED's may be bottom-emitting OLED's, i.e., they emit light through substrate 102, or they may be top-emitting OLED's, i.e., they emit in the opposite direction. Signal line 104 and OLED power line 106 are formed on flexible printed circuit board 108 which is coupled to substrate 102. Frame 110 will also be coupled to substrate 102. Signal line 104 and OLED power line 106 may be formed of conventional materials such as copper leads formed on flexible printed circuit board 108. FIG. 2 shows an exploded side view of the prior art display device also shown in FIG. 1. Conductive lines 104 and 106 of flexible printed circuit board 108 are coupled to substrate 102 through ACF 112. Each of signal line 104 and OLED power line 106 typically terminate at a plurality of terminals that are electrically coupled to a corresponding plurality of contacts on substrate 102. As shown in FIG. 1, conductive signal line 104 and conductive power line 106 are connected to about the same peripheral location on substrate 102. When the size of TFT-OLED array 100 is large, signal line 104 and OLED power line 106 must accommodate high currents. Over the lifetime of the display device, the high currents cause either the conductive lines (104 and 106) themselves to break down or produce high temperatures which causes ACF 112 to break down and undesirably cause the various terminals and contacts associated with signal line 104 and OLED power line 106 to short. A typical conductive line that may be used as OLED power line 106 or signal line 104 may be a copper interconnect lead having a width of about 10 mils or 0.254 mm. Such a copper interconnect may safely accommodate currents in the vicinity of 500 milliamps. A 2" by 2" TFT-OLED array may utilize a current of 1 to 2 amps in "bright mode" when all OLED's are illuminated, however. Larger arrays have correspondingly higher current levels and it can be seen that even for a 2"×2" array, conventional copper interconnect leads are incapable of accommodating the associated current and are subject to being blown out and heating up causing the degradation and destruction of the ACF.

It would therefore be desirable to provide a display device that includes the advantage of OLED technology, the advantage of an anisotropic conductive film to connect current carrying lines to the substrate that includes the OLED array. It would be further desirable to provide a display device of increased dimension and which can accommodate the large currents necessary to power a large size array, without fear of the conductive lines being blown out or shorted due to the breakdown of the anisotropic conductive film.

SUMMARY OF THE INVENTION

To address these and other objects, and in view of its purposes, the present invention provides a method for forming a display device of organic light emitting diodes. The method includes providing a panel with a pixel array surrounded by a peripheral region, at least a pixel of the pixel array including an organic light emitting diode; providing a frame for joining to the panel; electrically coupling a signal line to the pixel array; joining a power line to the frame; and joining the frame to the panel.

According to another exemplary embodiment, the present invention provides a method for forming a display device of organic light emitting diodes. The method includes providing a panel with a pixel array surrounded by a peripheral region, at least a pixel of the pixel array including an organic light emitting diode and electrically coupling a signal line formed on a surface to the pixel array by physically joining the signal line and the surface to the panel at a first peripheral location. A power line is electrically coupled to the pixel array by physically joining the power line to the panel at a second peripheral location peripherally spaced apart from the first peripheral location, the power line comprising an insulated electrical cable. The method also includes providing a frame and joining the frame to the panel.

According to another exemplary embodiment, the present invention provides an electroluminescent display device. The device includes a transparent substrate including a pixel array disposed thereon and a peripheral area surrounding the pixel array. Each pixel of the pixel array includes an organic light emitting diode. A signal line is formed on a surface and physically coupled to the substrate through an anisotropic conductive film. A frame including a power line physically joined thereto, is joined to the substrate such that the power line is electrically coupled to the pixel array.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

Figure 1:
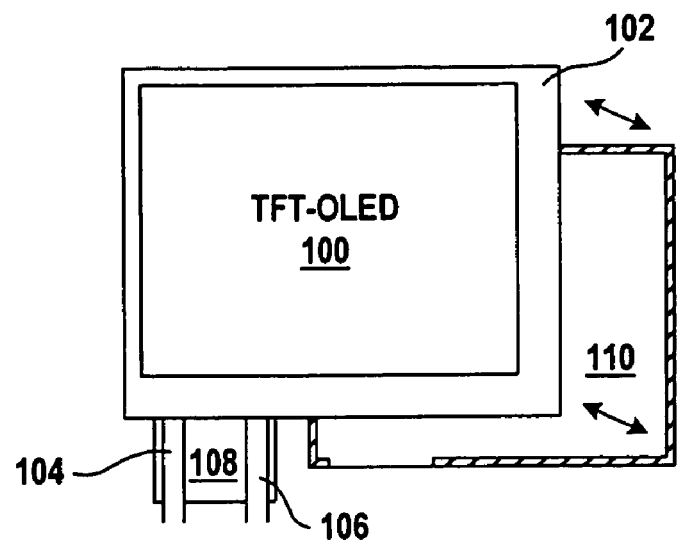
FIG. 1 is plan view of an OLED display device showing electrical connections, according to the PRIOR ART.
Figure 2:
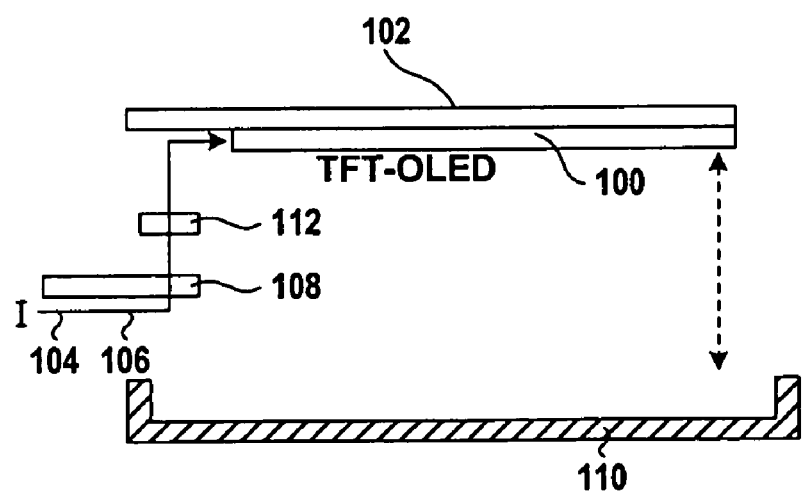
FIG. 2 is an exploded side view of an OLED display device showing electrical connections, according to the PRIOR ART.
Figure 3:
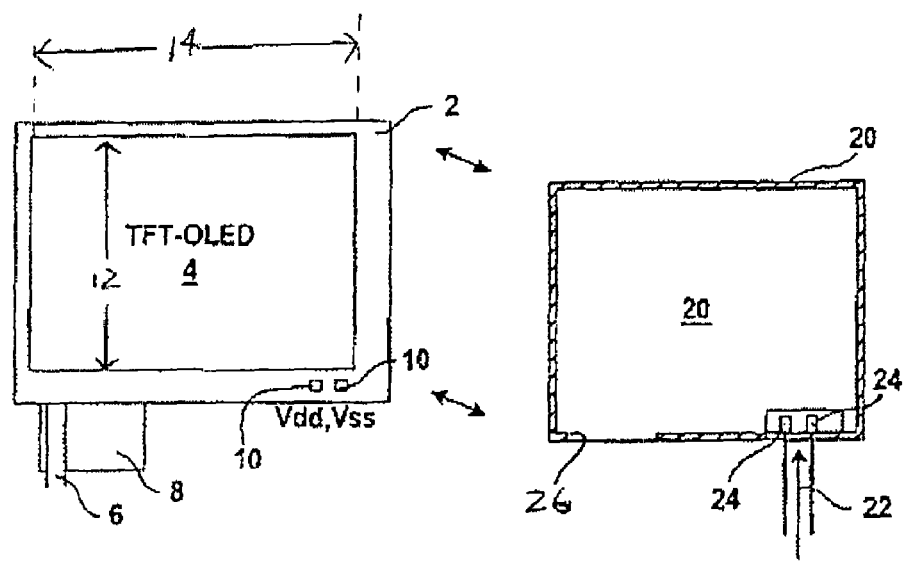
FIG. 3 is an exploded view of components of an OLED display device according to the present invention.

The present invention provides an electroluminescent display device in which the power line and signal line are separately formed and separately connected to the TFT-OLED array at spaced-apart locations. FIG. 3 shows an exemplary embodiment of the electroluminescent device of the present invention at a stage during the assembly process. TFT-OLED array 4 is formed on substrate 2 and is electrically coupled to conductive interconnects (not shown) formed on the surface of substrate 2 that also includes TFT-OLED array 4. Substrate 2 may be formed of various conventional materials including transparent materials such as quartz, glass, plastics and other suitable materials known in the art and TFT-OLED array 4 may be formed on the underside of substrate 2 in the illustrated embodiment. The TFT-OLED's of TFT-OLED array 4 may advantageously be bottom-emitting OLED's, i.e., they emit light through substrate 2, but top-emitting OLED's and other arrangements may be used in other exemplary embodiments. TFT-OLED array includes dimensions 12 and 14, each of which may range from 1 to 20 inches in various exemplary embodiments. Signal line 6 is formed on or in printed circuit board 8 which may be formed of various materials and may be a flexible printed circuit board in various exemplary embodiments. In one embodiment, signal line 6 may be formed of copper or other suitable conductive materials and may include a 0.254 mm width. In one embodiment, signal line 6 may be formed from a patterned thin film formed on the surface of printed circuit board 8. Signal line 6 may include a plurality of terminals disposed on printed circuit board 8, that are to be connected to corresponding contacts (not shown) on substrate 2. Conventional methods may be used to join signal line 6 and printed circuit board 8, to substrate 2. In one exemplary embodiment, printed circuit board 8 including signal line 6 may be coupled to substrate 2 using an ACF such as illustrated in the prior art exploded view of FIG. 2. Terminals of signal line 6 are coupled to contacts formed on substrate 2 and which are interconnected to TFT-OLED array 4. In the illustrated embodiment, signal line 6, formed on the top, facing surface of printed circuit board 8, may be coupled to the surface of the underside of substrate 2 that contains the TFT-OLED array but other arrangements may be used in other exemplary embodiments. Substrate 2 also includes contacts 10 that are to be coupled to an associated terminal of OLED power line 22 and provide electrical connection that enables OLED power line 22 to power the TFT-OLED array 4. Exemplary contacts 10–$V_{dd}$ and $V_{ss}$ are illustrated, but in other exemplary embodiments, other contacts may be provided.

OLED power line 22 is coupled to frame 20. OLED power line 22 may be formed of various suitable materials that can accommodate the current level required and determined by the size of TFT-OLED array 4. OLED power line 22 may be a conventional electrical cable, i.e. a conductive wire surrounded by an insulating cover. OLED power line 22 includes a plurality of terminals 24 that will correspond to contacts 10 formed on substrate 2. Terminals 24 and, therefore, OLED power line 22 are physically joined to frame 20 using conventional methods. Soldering may be used, for example. Frame 20 may be formed of various conventional materials and is used to cover TFT-OLED array 4. In some exemplary embodiments, frame 20 may be a transparent material to accommodate OLED's that emit light in the direction opposite the substrate 2 and through frame 20. In other exemplary embodiments, other materials including opaque materials may be used. Frame 20 includes notch 26 which will receive printed circuit board 8 when the components, i.e. substrate 2 and frame 20, are joined. Printed circuit board 8 and corresponding notch 26 may be various dimensions and notch 26 is advantageously peripherally spaced apart from OLED power line 22 including terminals 24. Terminals 24 will be coupled to corresponding contacts 10 of substrate 2 when the components are joined.

Although the illustrated embodiment shown in FIG. 3 shows TFT-OLED array 4 array formed on the underside of substrate 2 and signal 6 formed on the surface of printed circuit board 8 that faces the underside of substrate 2 in the embodiment in which TFT-OLED array 4 emits light through substrate 2, it should be understood that this is exemplary only and in other exemplary embodiments, alternative wiring techniques may be used. For example, interconnect leads that extend through printed circuit board 8 and/or through substrate 2, may be used.

Figure 4:
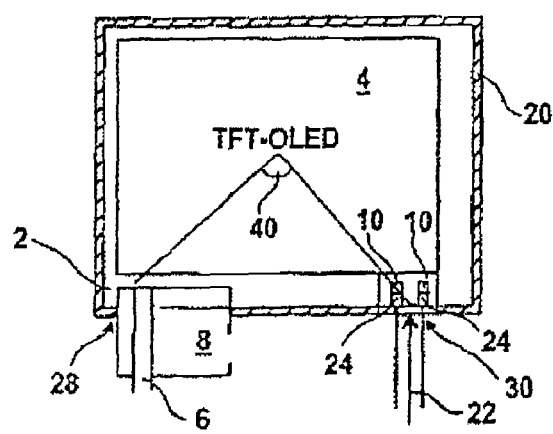
FIG. 4 is a plan view of components of an OLED display device according to the present invention.

Returning to the figures, FIG. 4 shows the display device after frame 20 is joined to substrate 2. Conventional methods may be used to mechanically join frame 20 to substrate 2. According to the exemplary embodiment shown in FIG. 3, substrate 2 including TFT-OLED array 4, is disposed over frame 20 to form the display device shown in FIG. 4. Signal line 6 which may carry a control signal is disposed at first peripheral location 28 which is spaced apart from second peripheral location 30 where OLED power line 22 is coupled to the display device. First peripheral location 28 is spaced from second peripheral location 30 by angle 40 which is at least 60°, with respect to the geometrical center of substrate 2.

Figure 5:
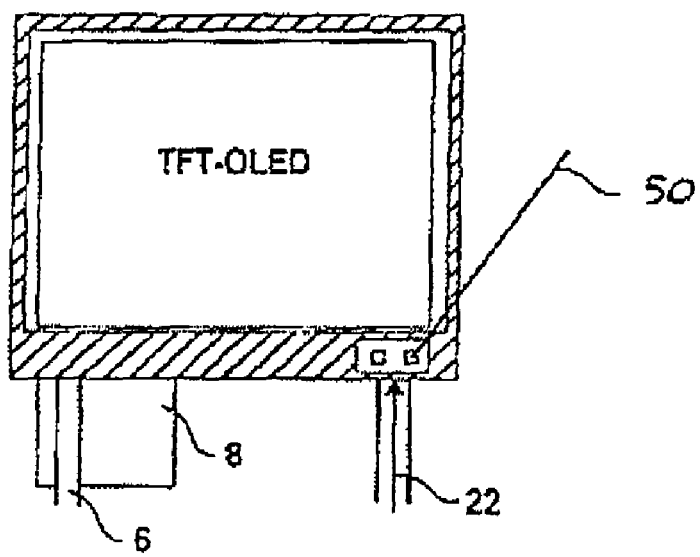
FIG. 5 is a plan view showing laser soldering used to form an exemplary OLED display device according to the present invention.

According to the illustrated embodiment of FIG. 4 in which substrate 2 is transparent, it can be seen that terminals 24 of OLED power line 22 are aligned with contacts 10 formed on the underside of substrate 2. conventional means may be used to couple terminals 24 to contacts 10 so that OLED power line 22 is coupled to TFT-OLED array 4. In one exemplary embodiment, terminals 24 may be soldered to corresponding contacts 10 and in one particular exemplary embodiment such as shown in FIG. 5, a laser beam 50 may be used to laser-solder terminals 24 to contacts 10 to provided soldered contacts 28. FIG. 5 also shows peripheral cover 32 which may aid in clamping Frame 20 to substrate 2 and may extend peripherally around the display device.

Figure 6:
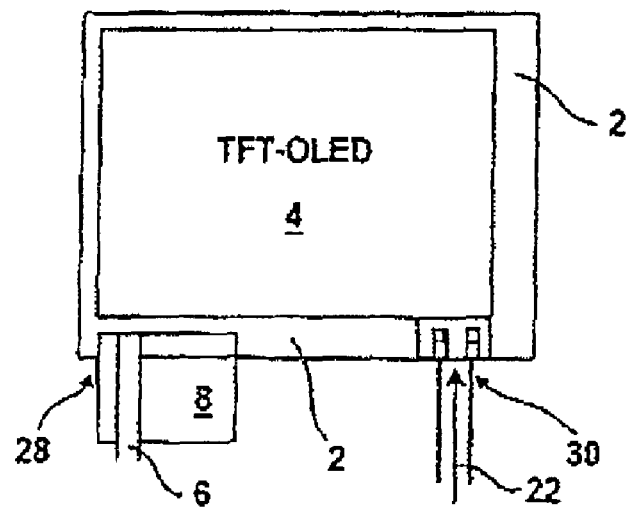
FIG. 6 is a plan view showing another exemplary embodiment showing components of an OLED display device according to the present invention.

In another exemplary embodiment shown in FIG. 6, each of OLED power line 22 and control signal line 6 may be physically joined to substrate 2 but at different locations. According the this exemplary embodiment, OLED power line 22 may be a conventional cable consisting of a metal wire surrounded by an insulating jacket and control signal line 6 may be formed on a surface such as a printed circuit board 8. Therefore OLED power line 22 and control signal line 6 are formed on discrete and separate mediums and connected at peripheral locations 30 and 28, respectively, that are spaced at least 60° apart from one another. After control signal line 6 and OLED power line 22 are coupled to substrate 2 and therefore electrically connected to TFT-OLED array 4, a cover, frame or other mechanical features may be joined over TFT-OLED array 4.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper,""horizontal," "vertical,", "above," "below," "up," "down," "top" and "bottom" as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a display device of organic light emitting diodes, comprising:

providing a panel with a pixel array thereon and surrounded by a peripheral region, at least a pixel of said pixel array comprising an organic light emitting diode and a thin film transistor;

electrically coupling a signal line formed on a surface, to said pixel array by physically joining said signal line and said surface to said panel using anisotropic conductive film at a first peripheral location;

electrically coupling a power line to said pixel array by physically joining said power line to said panel using anisotropic conductive film at a second peripheral location, said power line comprising an insulated electrical cable; and providing a frame and joining said frame to said panel, wherein said first peripheral location is spaced from said second peripheral location by an angle of at least 60° with respect to a geometrical center of said panel.

* * * * *